United States Patent
Tanida et al.

(10) Patent No.: US 8,778,778 B2
(45) Date of Patent: Jul. 15, 2014

(54) MANUFACTURING METHOD OF SEMICONDUCTOR DEVICE, SEMICONDUCTOR SUBSTRATE, AND CAMERA MODULE

(75) Inventors: Kazumasa Tanida, Oita (JP); Masahiro Sekiguchi, Kanagawa (JP); Masayuki Dohi, Kanagawa (JP); Tsuyoshi Matsumura, Oita (JP); Hideo Numata, Oita (JP); Mari Otsuka, Oita (JP); Naoko Yamaguchi, Kanagawa (JP); Takashi Shirono, Tokyo (JP); Satoshi Hongo, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 307 days.

(21) Appl. No.: 13/212,644

(22) Filed: Aug. 18, 2011

(65) Prior Publication Data
US 2012/0049312 A1 Mar. 1, 2012

(30) Foreign Application Priority Data
Aug. 25, 2010 (JP) .................................. 2010-188449

(51) Int. Cl.
*H01L 21/77* (2006.01)
(52) U.S. Cl.
USPC ............... 438/459; 438/22; 438/24; 438/25; 438/28; 438/34; 438/57; 438/60; 438/73; 438/74; 438/75; 257/447; 257/228; 257/460; 257/E27.13; 257/E21.122
(58) Field of Classification Search
None
See application file for complete search history.

(56) References Cited

U.S. PATENT DOCUMENTS

| | | | |
|---|---|---|---|
| 5,668,045 A | * | 9/1997 | Golland et al. ............... 438/459 |
| 6,113,721 A | * | 9/2000 | Secco d'Aragona et al. . 156/154 |
| 2010/0148290 A1 | * | 6/2010 | Park .............................. 257/432 |
| 2010/0255682 A1 | * | 10/2010 | Trickett et al. ................ 438/692 |
| 2011/0073983 A1 | | 3/2011 | Tanida et al. |

FOREIGN PATENT DOCUMENTS

| | | |
|---|---|---|
| JP | 55-38024 | 3/1980 |
| JP | 2005-322745 | 11/2005 |
| JP | 2005-353996 | 12/2005 |
| JP | 2007-13089 | 1/2007 |
| JP | 2010-62414 | 3/2010 |
| TW | 200616215 A | 5/2006 |
| TW | 200811938 A | 3/2008 |

OTHER PUBLICATIONS

U.S. Appl. No. 13/479,968, filed May 24, 2012, Hongo et al.
U.S. Appl. No. 13/152,057, filed Jun. 2, 2011, Kazumasa Tanida et al.
U.S. Appl. No. 13/422,966, filed Mar. 16, 2012, Yamaguchi et al.
U.S. Appl. No. 13/428,424, filed Mar. 23, 2012, Hongo.

(Continued)

*Primary Examiner* — Fei Fei Yeung Lopez
(74) *Attorney, Agent, or Firm* — Oblon, Spivak, McClelland, Maier & Neustadt, L.L.P.

(57) ABSTRACT

According to an embodiment, an active layer is formed on a first surface of a semiconductor substrate, a wiring layer is formed on the active layer, and an insulating layer is formed covering the wiring layer. The first surface of the semiconductor substrate is bonded to a support substrate via the insulating layer, and the semiconductor substrate bonded to the support substrate is thinned leaving the semiconductor substrate having a predetermined thickness which covers the active layer from a second surface. At least a part of area of the thinned semiconductor substrate is removed to expose the active layer.

7 Claims, 13 Drawing Sheets

(56) References Cited

OTHER PUBLICATIONS

Notice of Rejection issued Jan. 22, 2013 in Japanese Patent Application No. 2010-188449 (with English translation).

Combined Office Action and Search Report issued Sep. 23, 2013 in Taiwanese Patent Application No. 100130570 with English language translation and English translation of categories of cited documents.

* cited by examiner

MANUFACTURING METHOD OF SEMICONDUCTOR DEVICE, SEMICONDUCTOR SUBSTRATE, AND CAMERA MODULE

CROSS-REFERENCE TO RELATED APPLICATIONS

This application is based upon and claims the benefit of priority from the prior Japanese Patent Application No. 2010-188449, filed on Aug. 25, 2010; the entire contents of which are incorporated herein by reference.

FIELD

Embodiments described herein relate generally to a manufacturing method of a semiconductor device, a semiconductor substrate, and a camera module.

BACKGROUND

A back-side illuminated image sensor is devised in which a light-receiving surface of photodiodes is provided on the back surface of a semiconductor substrate, contrary to a front-side illuminated image sensor. In the back-side illuminated image sensor, sensitivity higher than that of the front-side illuminated image sensor can be obtained because wiring and many films need not be formed on the light-receiving surface. In the back-side illuminated image sensor, to efficiently collect light entering the back surface into photodiodes, thinning of the semiconductor substrate is required. For example, when visible light enters, the thickness of the semiconductor substrate is required to be thinner than 20 μm so as to prevent electrical charges generated on the light-receiving surface from diffusing and causing degradation of resolution before the electrical charges are collected into the photodiodes.

For example, such a semiconductor device is formed by the method described below. A semiconductor substrate on which photodiodes and integrated circuits are formed on its surface is prepared. A support substrate having substantially the same diameter as that of the semiconductor substrate is bonded to the semiconductor substrate. The support substrate is thinned from the back surface of the semiconductor substrate to a position near the photodiodes, and functions as a reinforcing body when the light-receiving surface is formed. Next, an antireflection film, a color filter, and microlenses for collecting light are provided on the light-receiving surface, and thereby a so-called back-side illuminated image sensor is formed in which energy rays such as light and electrons emitted from the back surface are received and collected into the photodiodes.

Further, electrode portions electrically connected to the integrated circuits of the semiconductor substrate are formed, and then the bonded body of the semiconductor substrate and the support substrate is cut and divided by a dicing blade. A divided chip is bonded to a ceramic package or the like, and the electrode portions of the chip are electrically connected with wiring formed on the ceramic package by wire bonding, and thereby a semiconductor device is formed.

In the semiconductor device described above, the semiconductor substrate is thinned partway from the back surface of the semiconductor substrate toward a layer on the front surface in which the photodiodes are formed by mechanical grinding, chemical mechanical polishing, and/or wet etching. To efficiently collect energy rays into the photodiodes, it is desired that the semiconductor substrate is thinned as much as possible.

However, when the semiconductor substrate is thinned, a wiring layer (formed of a metal material) is exposed on the outer circumference of the semiconductor substrate. If the wet etching is performed in that state, there are problems that the metal of the wiring layer is eluded into an etching solution, so not only the life of the etching solution is reduced, but also etching residue is generated due to reduction of etching rate and the yield ratio is reduced. In addition, there are also problems that, if eluded metal ions attach to an Si layer which is the light-receiving surface, the metal ions easily diffuse into Si, so imaging characteristics are degraded and the yield ratio is reduced.

BRIEF DESCRIPTION OF THE DRAWINGS

FIGS. 3A to 3I are diagrams illustrating an example of a manufacturing method of a semiconductor device according to a second embodiment.

DETAILED DESCRIPTION

In a manufacturing method of a semiconductor device according to embodiments of the present invention, an active layer is formed on a first surface of a semiconductor substrate, a wiring layer is formed on the active layer, and an insulating layer is formed covering the wiring layer. The first surface of the semiconductor substrate is bonded to a support substrate via the insulating layer, and the semiconductor substrate bonded to the support substrate is thinned leaving the semiconductor substrate having a predetermined thickness which covers the active layer from a second surface. At least a part of area of the thinned semiconductor substrate is removed to expose the active layer.

Hereinafter, a manufacturing method of semiconductor device, a semiconductor device, and a camera module according to the embodiments will be described in detail. The present invention is not limited by the embodiments.

First Embodiment

Figure 1:
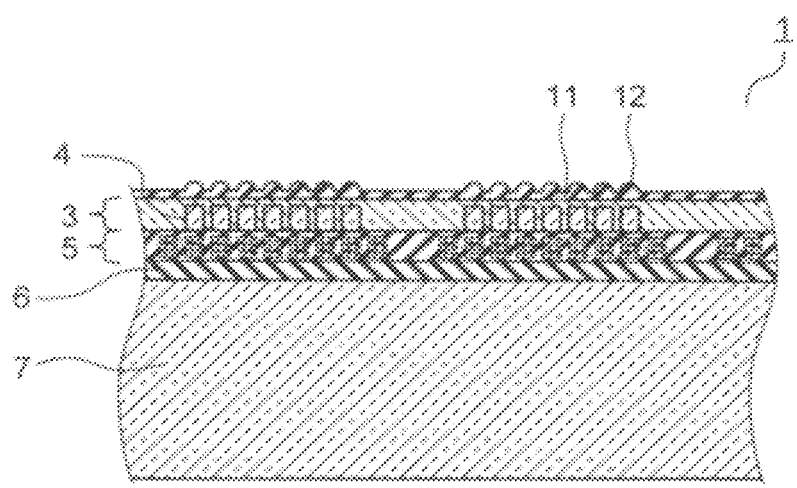
FIG. 1 is a schematic view illustrating an overview of a cross-section of a semiconductor device according to a first embodiment.

FIG. 1 is a schematic view illustrating an overview of a cross-section of a semiconductor device 1 according to a first embodiment. As illustrated in FIG. 1, the semiconductor device 1 of the present embodiment includes an active layer 3 on which photodiodes 4 and transistors (not illustrated in FIG. 1) are formed. The semiconductor device 1 is thinned and configured as a back-side illuminated image sensor including a light-receiving surface 11 that receives energy rays such as light and electrons emitted to the back surface and collects them into the photodiodes 4, an optical layer (not illustrated in FIG. 1) such as an antireflection film or a color filter layer, and microlenses 12. A wiring layer 5 electrically connected to the active layer 3 is formed on the active layer 3. A bonding layer (insulating layer) 6 is provided on the wiring layer 5, and the bonding layer 6 and the support substrate 7 are bonded together.

FIGS. 2A to 2H are diagrams illustrating an example of a manufacturing method of the semiconductor device 1 according to the present embodiment. Constituent elements given the same reference numeral in the drawings are the same elements or corresponding elements. The manufacturing method of the semiconductor device 1 according to the present embodiment will be described with reference to FIGS. 2 and 3.

Figure 2A:
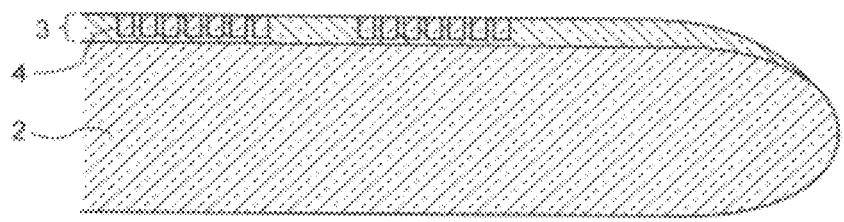
FIGS. 2A to 2H are diagrams illustrating an example of a manufacturing method of the semiconductor device according to the first embodiment.

In a first process illustrated in FIG. 2A, a wafer is prepared on which the active layer 3 is formed in which the photodiodes 4 and the transistors (not illustrated in the drawings) are formed on a first surface of a semiconductor substrate 2. A forming method of the active layer 3 is not limited, and any process can be used to form the active layer 3.

Figure 2B:
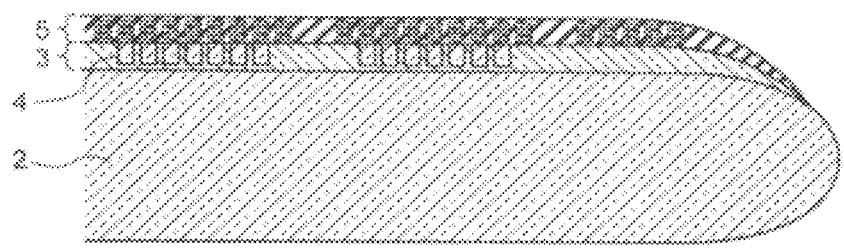

In a second process illustrated in FIG. 2B, the wiring layer 5 formed from a metal material and an insulating material is formed on the active layer 3 by a sputtering method, a CVD (Chemical Vapor Deposition) method, an evaporation method, or a plating method by using a predetermined pattern mask (not illustrated in the drawings). The metal material is formed in a state in which, for example, a single layer or multiple layers of a high resistance metal material (Ti, TiN, TiW, Ni, Cr, TaN, CoWP, and the like) or a low resistance metal material (Al, Al—Cu, Al—Si—Cu, Cu, Au, Ag, and the like) are stacked. The insulating material is formed by, for example, a CVD method, a spin coat method, or a spray coat method. The insulating material is formed in a state in which, for example, a single layer or multiple layers of a silicon dioxide film ($SiO_2$), a silicon nitride film ($SiN_x$), an SiOF (Fluorine-doped $SiO_2$) film, a porous SiOC (Carbon-doped $SiO_2$) film, a polyimide film, a BCB (benzocyclobutene) film, an epoxy resin film, and the like are stacked.

The wiring pattern in the wiring layer 5 is usually formed on an area 2 to 3 mm inside from the outer circumference of the semiconductor substrate 2. However, the wiring pattern may be formed outside the area described above. The insulating material is formed to the outer circumference of the semiconductor substrate 2.

Figure 2C:
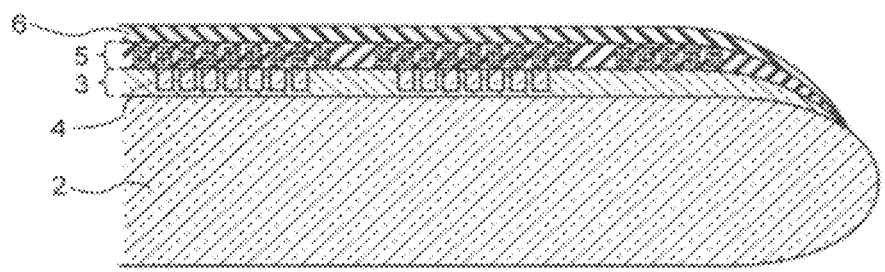

In a third process illustrated in FIG. 2C, the bonding layer 6 is formed on the wiring layer 5 to cover the wiring layer 5 by a spin coat method or a spray coat method. The bonding layer 6 is formed in a state in which, for example, a single layer or multiple layers of a silicon dioxide film, a silicon nitride film, an SiOF film, a porous SiOC film, a polyimide film, a BCB film, an epoxy resin film, and the like are stacked. The surface of the bonding layer 6 is flattened by chemical mechanical polishing or the like if needed.

Figure 2D:
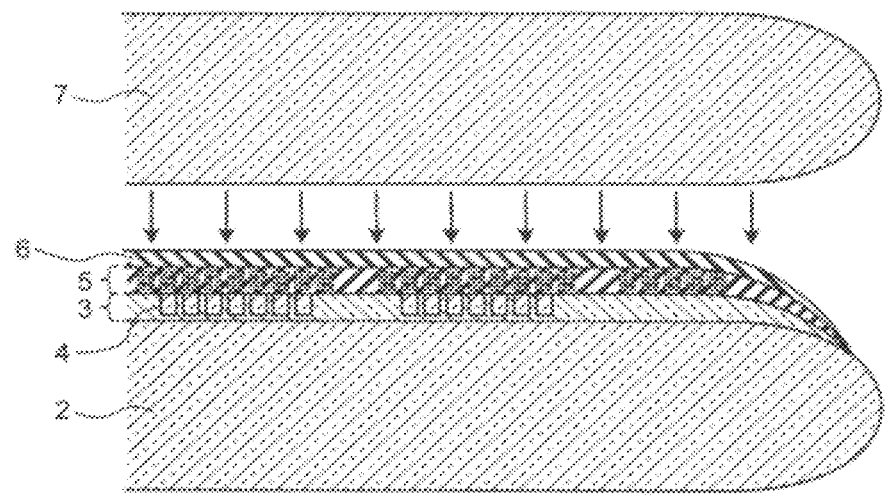

In a fourth process illustrated in FIG. 2D, a support substrate 7 having substantially the same size as that of the semiconductor substrate 2 is attached to the bonding layer 6. At this time, the surface of the bonding layer 6 and the surface of the support substrate 7 may be directly attached to each other. A metal film of gold (Au), copper (Cu), tin (Sn), or an alloy of these metals may be formed on the surfaces, and the surfaces may be attached to each other via the metal films (not illustrated in the drawings). The support substrate 7 is formed of, for example, silicon (Si), gallium arsenide (GaAs), borosilicate glass, quartz glass, soda-lime glass, epoxy resin, polyimide resin, or the like.

When the surface of the bonding layer 6 and the surface of the support substrate 7 are directly bonded together, by a cleaning process (not illustrated in the drawings) of the surface of the bonding layer 6 and the surface of the support substrate 7, organic substances such as carbon and metal pollutants such as Cu and Al on the surfaces are removed. The cleaning process may be a wet process such as organic cleaning using acetone, alcohol, or ozone water ($O_3$) and acid and alkaline cleaning using hydrofluoric acid (HF), dilute hydrofluoric acid (DHF), sulfate hydrogen peroxide water, ammonia hydrogen peroxide water, or hydrochloride hydrogen peroxide water. The cleaning process may be a dry process such as plasma processing excited by a single or multiple gases such as hydrogen, nitrogen, oxygen, dinitrogen monoxide ($N_2O$), argon, and helium. The cleaning process may be a combination of a wet process and a dry process. It is desired that the surface of the bonding layer 6 and the surface of the support substrate 7 are both processed. However, either one of the surfaces may be processed.

Figure 2E:
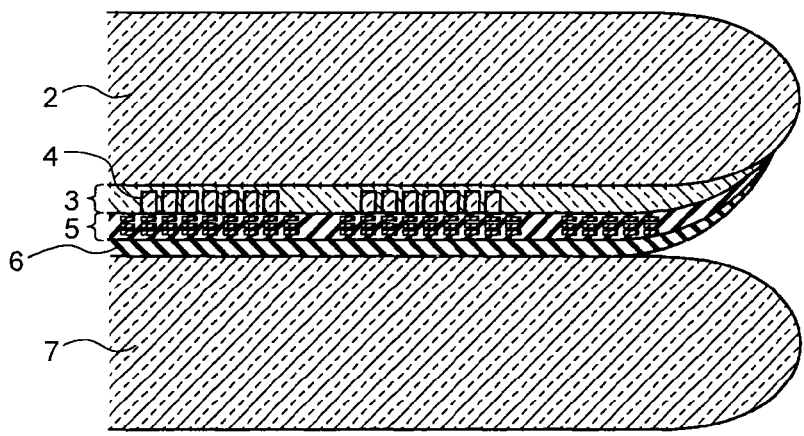

FIG. 2E illustrates an upside down state of the substrates and the layers after the bonding. As illustrated in FIG. 2E, the outer circumferential portions of the semiconductor substrate 2 and the support substrate 7 are not flat, and the outer circumferential portions of the active layer 3, the wiring layer 5, and the bonding layer 6 are not flat, so there are areas not bonded (nonbonded areas) and areas where the bonding force is low (weakly bonded areas) in the outer circumferential portions.

Figure 2F:
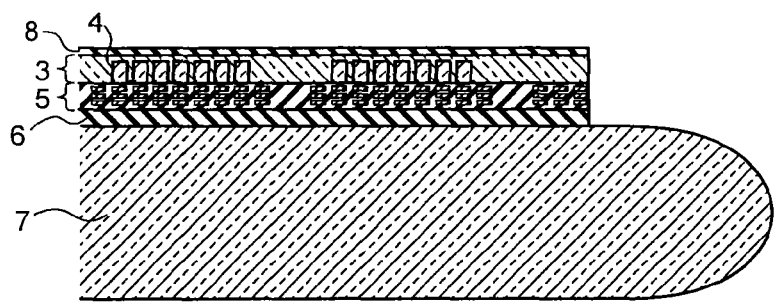

In a fifth process illustrated in FIG. 2F, the semiconductor substrate 2 is thinned from a second surface (back surface) by mechanical grinding and/or chemical mechanical polishing, and a residual film 8 which is the semiconductor substrate 2 remaining after the thinning is formed. When the semiconductor substrate 2 is a silicon substrate, the residual film 8 is desired to have a thickness of about several μm to 50 μm, although it depends on process uniformity of the mechanical grinding and/or the chemical mechanical polishing. When the semiconductor substrate 2 is an SOI (Silicon on Insulator) substrate, the residual film 8 may be a buried oxide film layer (thickness is tens nm to hundreds nm) or may be a silicon layer (about several μm to 50 μm). At this time, part or all of the bonding layer 6 and the wiring layer 5 of the nonbonded areas and the weakly bonded areas on the outer circumferential portion are removed by peeling and breaking when the thinning is performed, so the metal wiring pattern of the wiring layer 5 is exposed on the outer circumferential of the semiconductor substrate 2.

Figure 2G:
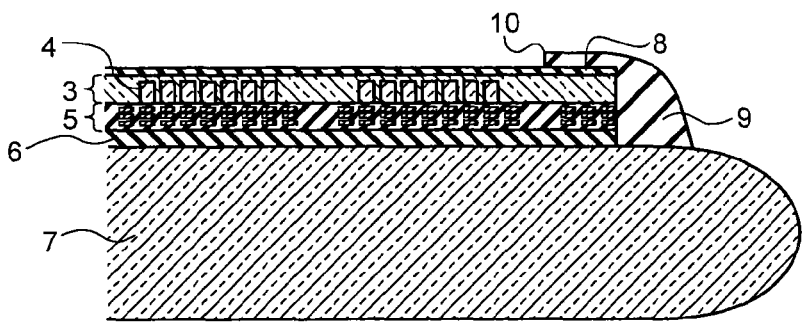

In a sixth process illustrated in FIG. 2G, a protective film 9 made of an organic material is formed by using a predetermined pattern mask (not illustrated in the drawings) so that the protective film 9 covers the surface of the outer circumferential portion of the residual film 8 (the outer circumferential portion of the second surface of the thinned semiconductor substrate 2) and the outer circumferential side surface of the active layer 3, the wiring layer 5, and the bonding layer 6 and includes an opening 10. The protective film 9 is formed by a spin coat method or a spray coat method and made of a photosensitive resist material. The protective film 9 may be directly formed on a predetermined position by a dispense method or the like without using a pattern mask, or may be made of a polyimide film, a BCB (benzocyclobutene) film, an epoxy resin film, or the like. Thereby, the surface of the outer circumferential portion of the residual film 8 is covered by the protective film 9, and exposed in the area of the opening 10 except for the outer circumferential portion.

Figure 2H:
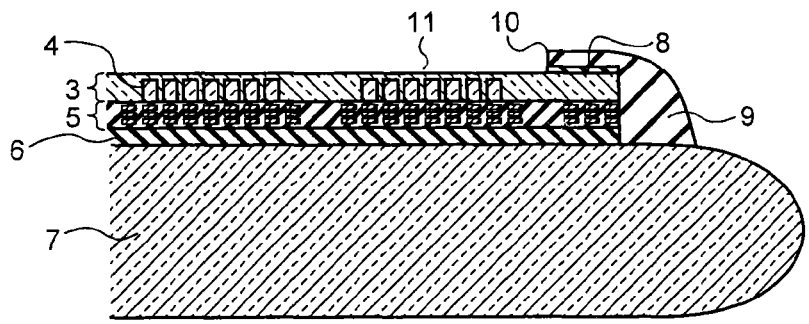

In a seventh process illustrated in FIG. 2H, at least the residual film 8 inside the opening 10 is removed by a wet etching method and the light-receiving surface 11 is formed.

The width of the protective film 9 formed on the surface of the outer circumferential portion (specifically, the difference between the radius of the semiconductor substrate 2 and the radius of the opening 10) may be any value if the light-receiving surface 11 can be formed on a desired area. However, the width is desired to be long enough to cover the area removed due to nonbonding or weak bonding, and for example, the width may be about 0.5 mm. When the protective film 9 is an organic film, the thickness of the protective film 9 is desired to be about 1 to 10 μm.

By the process described above, the semiconductor substrate 2 is thinned to a thickness in which energy rays such as light and electrons emitted to the light-receiving surface 11 can be collected by the photodiodes 4 formed in the active layer 3 on the first surface. Thereafter, an optical layer such as an antireflection film or a color filter layer (not illustrated in the drawings) and microlenses 12 are formed, and the semiconductor substrate 2 is divided into chips to obtain the semiconductor device 1 illustrated in FIG. 1.

Although, in the present embodiment, a manufacturing method of a back-side illuminated image sensor is described, it is not limited to this, and the method for forming a protective film on the surface of the outer circumferential portion and the side surface of the outer circumferential portion can be applied to a semiconductor device other than the back-side illuminated image sensor in the same manner as in the present embodiment if the semiconductor device is formed by bonding two substrates together and thinning at least one of the substrates after the bonding to expose an active layer.

As described above, according to the manufacturing method of the semiconductor device 1 of the present embodiment, the semiconductor substrate 2 bonded to the support substrate 7 is thinned from the second surface side to a predetermined thickness in which the active layer 3 is not exposed, and then the protective film 9 is formed on the second surface of the semiconductor substrate 2 including the outer circumferential portion. Therefore, the wiring layer 5 is covered by the protective film 9 on the outer circumferential portion of the semiconductor substrate 2, so the metal in the wiring layer 5 is not eluted into an etching solution even when a wet etching is performed to expose the active layer 3 and form the light-receiving layer 11. Therefore, the life of the etching solution is not reduced, and the yield ratio is not reduced by generation of etching residue due to reduction of etching rate.

Metal is prevented from being eluted from the wiring layer 5, so the metal does not attach to the light-receiving surface 11 and the yield ratio is improved without degrading imaging characteristics. When the semiconductor substrate 2 is thinned, part or all of the nonbonded areas of the outer circumferential portion of the semiconductor substrate 2 are removed, so the diameter of the semiconductor substrate 2 becomes smaller than the diameter of the support substrate 7. Therefore, the outer circumference of the semiconductor substrate 2 is located inside the outer circumference of the support substrate 7, and when the protective film 9 is formed on the second surface of the semiconductor substrate 2, the protective film 9 covers the outer circumferential portion of the semiconductor substrate 2 and the surface of the support substrate 7 which is exposed from the outer circumference of the semiconductor substrate 2, so the wiring layer 5 is more reliably covered. Therefore, the risk of metal pollution can be further reduced. Further, the protective film 9 is formed of an organic material, so when the protective film is formed on the second surface of the semiconductor substrate 2 by a spin coat method, it is possible to form a raised portion on the outer circumferential portion or make the protective film thicker. Therefore, the risk of metal pollution can be furthermore reduced.

Second Embodiment

FIGS. 3A to 3I are diagrams illustrating an example of a manufacturing method of a semiconductor device according to a second embodiment. The configuration of the semiconductor device of the present embodiment is the same as the configuration of the semiconductor device of the first embodiment. The same portions as those of the first embodiment or portions corresponding to those of the first embodiment are given the same reference numerals as those in the first embodiment, and redundant descriptions will be omitted.

The first to the fifth processes illustrated in FIGS. 3A to 3F are the same as the first to the fifth processes of the first embodiment.

Figure 3A:
Figure 3B:
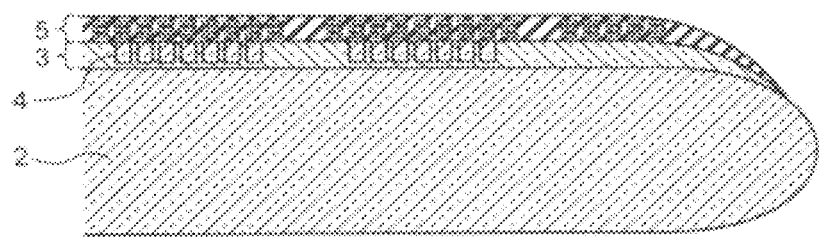
Figure 3C:
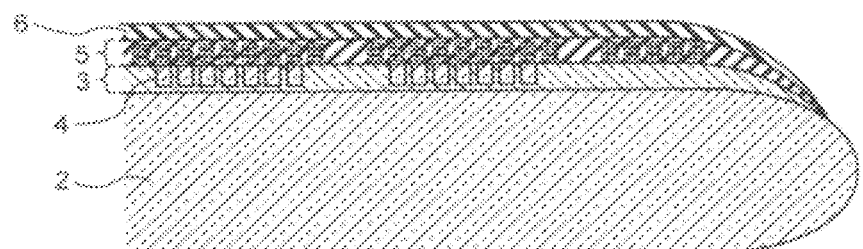
Figure 3D:
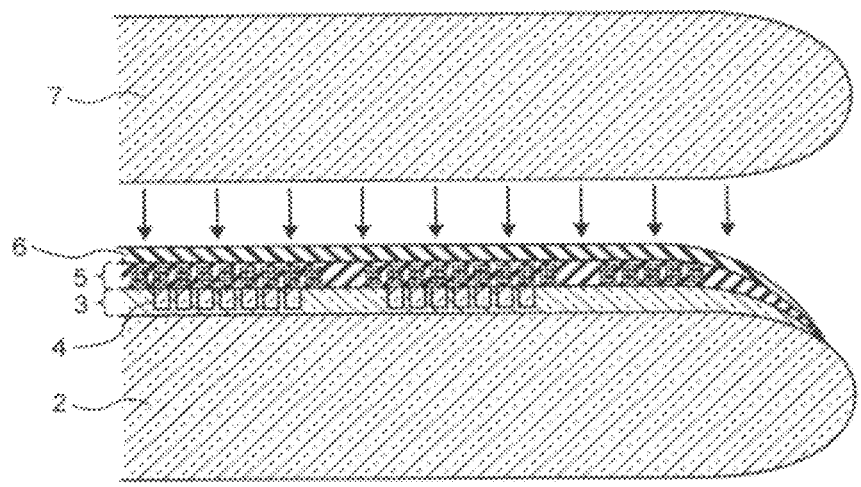
Figure 3E:
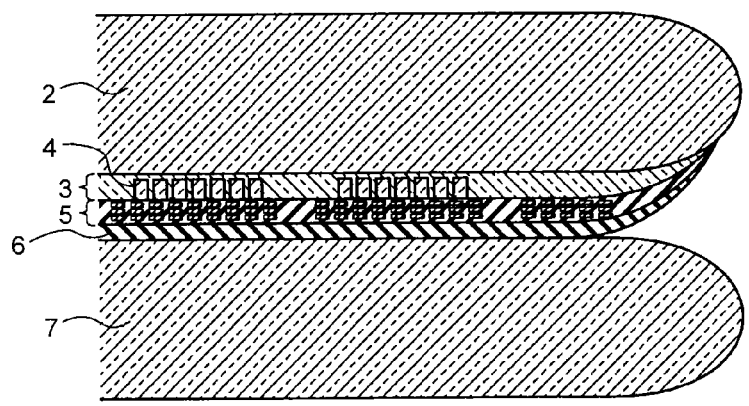
Figure 3F:
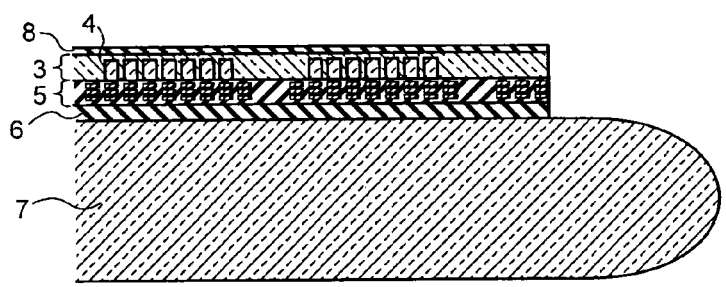
Figure 3G:
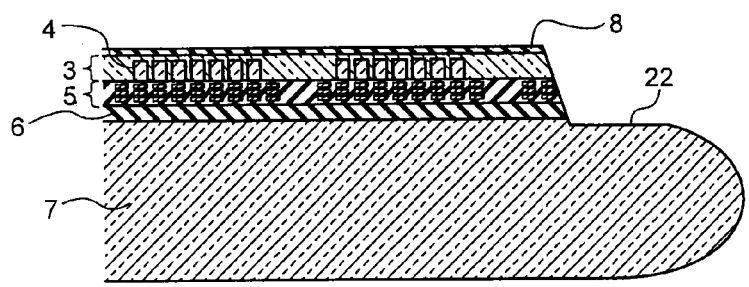

In the present embodiment, after the thinning of the fifth process, in the sixth process illustrated in FIG. 3G, an L-shaped side wall 22 is formed by removing the outer circumferential portions of the residual film 8, the active layer 3, the wiring layer 5, and the bonding layer 6 and a predetermined depth of the outer circumferential portion of the support substrate 7. The L-shaped side wall 22 is formed by, for example, mechanical polishing (grinding) using an abrasive cloth, a grindstone, or a blade. As illustrated in FIG. 3G, the outer circumferential portions of the residual film 8, the active layer 3, the wiring layer 5, and the bonding layer 6 are desired to be formed into a taper shape. The portion to be removed only has to include the outermost circumferential portion of the semiconductor substrate 2 after the fifth process is completed and portions from which the surfaces of the bonding layer 6 and the support substrate 7 are finally peeled, and for example, a ring-shaped portion in a plan view may be removed in a state in which a bevel-shaped portion of the outer circumference of the support substrate remains.

Figure 3H:
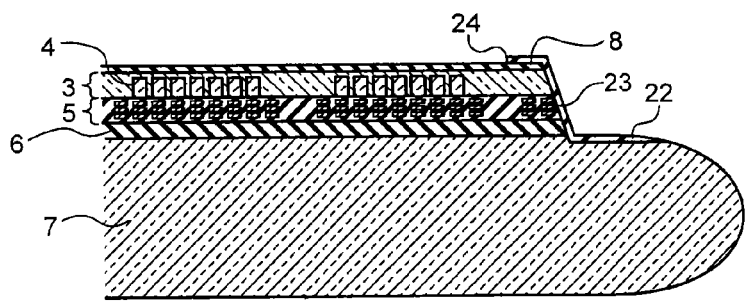
Figure 31:
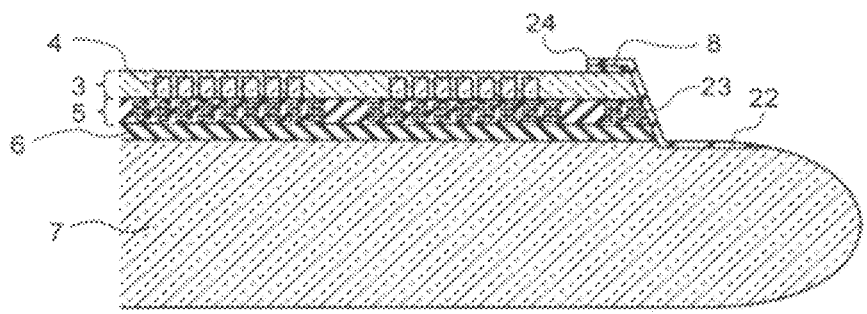

In the seventh process illustrated in FIG. 3H, a protective film 23 made of an inorganic material is formed by using a predetermined pattern mask (not illustrated in the drawings) so that the protective film 23 covers the surface of the outer circumferential portion of the residual film 8 and the side wall 22 formed on the active layer 3, the wiring layer 5, the bonding layer 6, and the support substrate 7. The protective film 23 is formed in a state in which a single layer or multiple layers of a silicon nitride film (SiNx) and/or a silicon oxynitride film (SiON) are stacked by a CVD method. The protective film 23 may be a Low-k film made of any combination of silicon, carbon, hydrogen, oxygen, nitrogen, and fluorine as long as the wet etching selectivity with respect to the residual film 8 is ensured. The protective film 23 may be formed of an organic material in the same manner as the protective film 9 of the first embodiment. In this case, the protective film 23 is formed by a spin coat method or a spray coat method and made of a photosensitive resist material. The protective film 23 may be directly formed on a predetermined position by a dispense method or the like without using a pattern mask, or may be made of a polyimide film, a BCB film, an epoxy resin film, or the like. The protective film 23 may be formed by stacking a plurality of films made of two or more materials. Thereby, the surface of the outer circumferential portion of the residual film 8 is covered by the protective film 23, and exposed in the area of the opening 24 except for the outer circumferential portion.

When the protective film 23 is an inorganic film such as a silicon nitride film (SiNx) or a silicon oxynitride film or a Low-k film, the thickness of the protective film 23 is desired to be about 10 to 300 nm. When the protective film 23 is an organic film, the depth is desired to be about 1 to 10 μm.

In the eighth process illustrated in FIG. 3I, at least the residual film 8 inside the opening 24 is removed by a wet etching method and the light-receiving surface 11 illustrated in FIG. 1 is formed.

The width of the protective film 24 formed on the surface of the outer circumferential portion (specifically, the difference between the radius of the semiconductor substrate 2 and the radius of the opening 24) may be any value if the light-receiving surface 11 can be formed on a desired area. However, the width is desired to be long enough to cover the area removed due to nonbonding or weak bonding, and for example, the width may be about 0.5 mm.

By the process described above, the semiconductor substrate 2 is thinned to a thickness in which energy rays such as light and electrons emitted to the light-receiving surface 11 can be collected by the photodiodes 4 formed in the active layer 3 on the first surface. Thereafter, an optical layer such as an antireflection film or a color filter layer (not illustrated in the drawings) and microlenses 12 are formed, and the semiconductor substrate 2 is divided into chips to obtain the semiconductor device 1 illustrated in FIG. 1.

As described above, according to the manufacturing method of the semiconductor device of the present embodiment, the outer circumferential portions of the semiconductor substrate 2 and the support substrate 7 are processed from the second surface side of the semiconductor substrate 2, part of the outer circumferential portions of the residual film 8, the active layer 3, the wiring layer 5, the bonding layer 6, and the support substrate 7 are removed, the continuous side wall 22 is formed, and then the protective film 23 is formed. Therefore, the same effect as that in the first embodiment can be obtained, and the risk of metal pollution can be further reduced because the wiring layer 5 is covered by the protective film 23 more reliably than that in the first embodiment. Further, if the protective film 23 is formed of a silicon nitride film and/or a silicon oxynitride film, it is possible to prevent the metal from diffusing from the wiring layer 5, so the risk of metal pollution can be furthermore reduced. If the protective film 23 is formed of a silicon nitride film and/or a silicon oxynitride film, the film thickness is smaller than that of the organic film, so the later process can be implemented without removing the protective film 23.

Third Embodiment

FIGS. 4A to 4I are diagrams illustrating an example of a manufacturing method of a semiconductor device according to a third embodiment. The configuration of the semiconductor device of the present embodiment is the same as the configuration of the semiconductor device of the first embodiment. The same portions as those of the first embodiment or portions corresponding to those of the first embodiment are given the same reference numerals as those in the first embodiment, and redundant descriptions will be omitted.

Figure 4A:
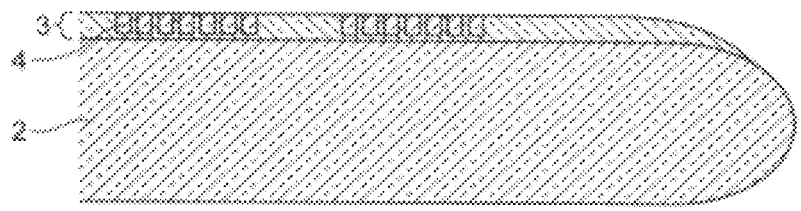
FIGS. 4A to 4I are diagrams illustrating an example of a manufacturing method of a semiconductor device according to a third embodiment.
Figure 4B:
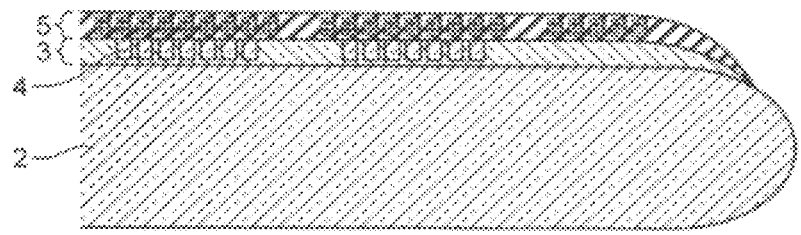
Figure 4C:
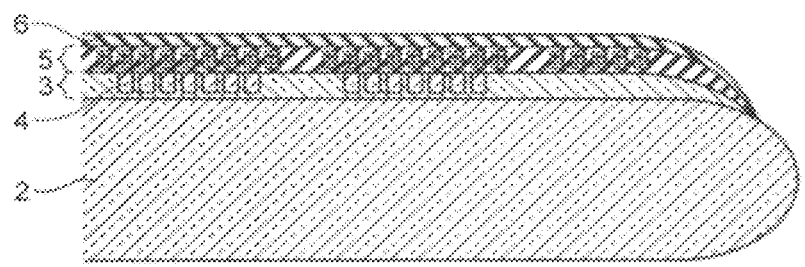
Figure 4D:
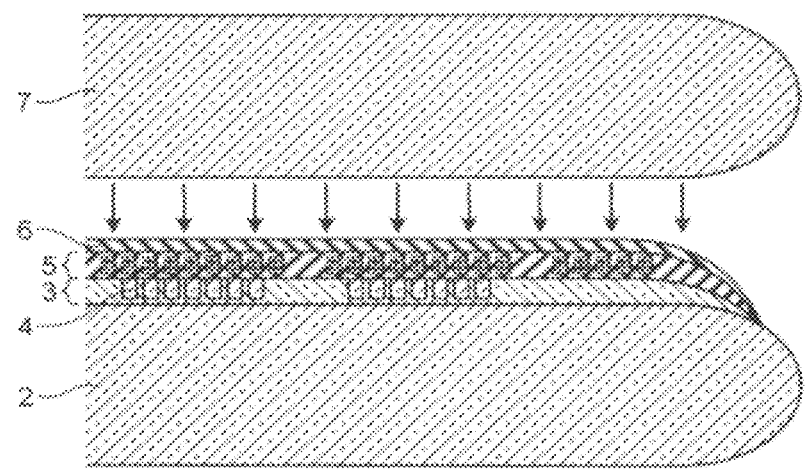
Figure 4E:
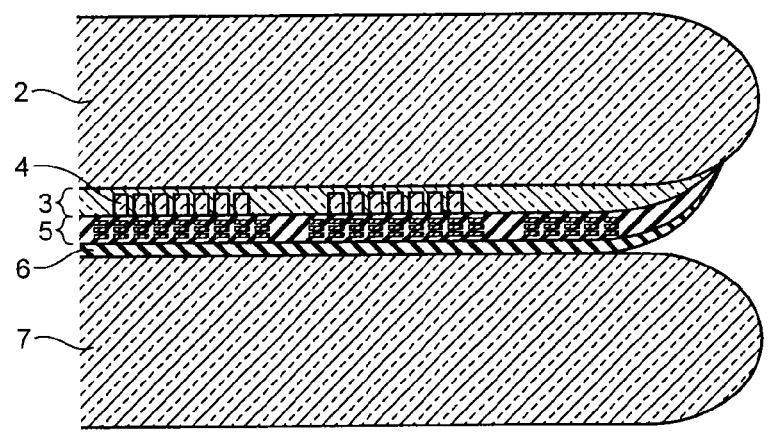

The first to the fourth processes illustrated in FIGS. 4A to 4D are the same as the first to the fourth processes of the first embodiment. FIG. 4E illustrates a state in which the support substrate 7 and the bonding layer 6 are bonded together in the fourth process and then they are placed upside down.

Figure 4F:
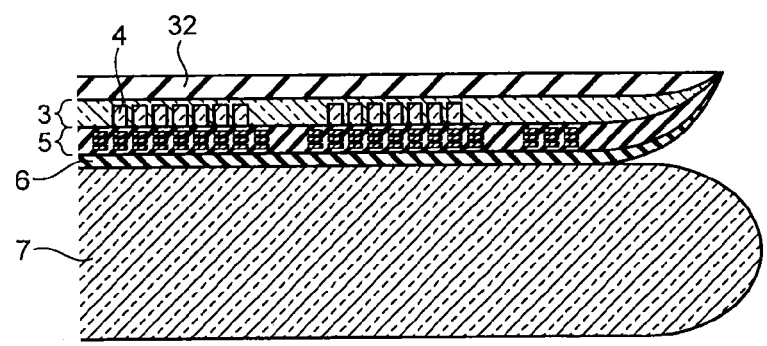

In the present embodiment, in the fifth process illustrated in FIG. 4F, the semiconductor substrate 2 is thinned from the second surface by mechanical grinding and/or chemical mechanical polishing, and a residual film 32 is formed. At this time, in the present embodiment, the thickness of the residual film 32 is formed to be thicker than the thickness of the residual film 8 of the first embodiment. For example, the thickness is desired to be about 10 μm to 50 μm so as not to make scratches on the active layer 3 over the residual film 32 by fragments peeled from the outer circumferential portions when the thinning is performed.

Figure 4G:
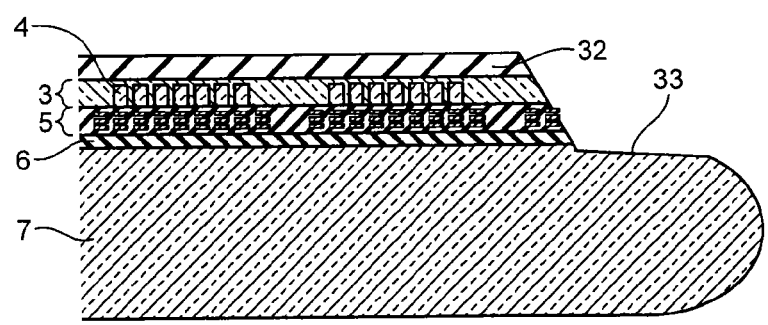

In the sixth process illustrated in FIG. 4G, an L-shaped side wall 33 is formed by removing the outer circumferential portions of the residual film 32, the active layer 3, the wiring layer 5, and the bonding layer 6 and a predetermined depth of the outer circumferential portion of the support substrate 7. The side wall 33 is formed by, for example, mechanical polishing (grinding) using an abrasive cloth, a grindstone, or a blade. The outer circumferential portions of the residual film 32, the active layer 3, the wiring layer 5, and the bonding layer 6 are desired to be formed into a taper shape. The portion to be removed only has to include the outermost circumferential portion of the semiconductor substrate 2 after the fifth process is completed and portions from which the surfaces of the bonding layer 6 and the support substrate 7 are finally peeled, and for example, a ring-shaped portion in a plan view may be removed in a state in which a bevel-shaped portion of the outer circumference of the support substrate remains.

Figure 4H:
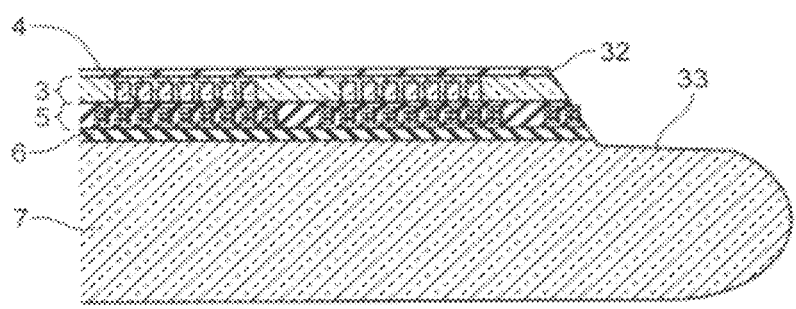

In the seventh process illustrated in FIG. 4H, the semiconductor substrate 2 is further thinned from the second surface by mechanical grinding and/or chemical mechanical polishing until the thickness of the residual film 32 becomes a predetermined thickness. When the semiconductor substrate 2 is a silicon substrate, the residual film 32 is desired to remain at a thickness of about several μm to 10 μm, although it depends on process uniformity of the mechanical grinding and/or the chemical mechanical polishing. When the semiconductor substrate 2 is SOI, the residual film 32 may be a buried oxide film layer (thickness is tens nm to hundreds nm) or may be a silicon layer (about several μm to 10 μm).

Figure 4I:
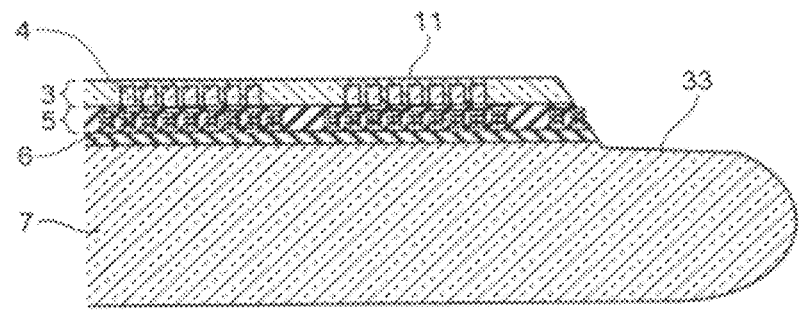

In the eighth process illustrated in FIG. 4I, the residual film 32 is removed by a wet etching method and the light-receiving surface 11 is formed.

In this way, the semiconductor device 1 is thinned to a thickness in which energy rays such as light and electrons emitted to the light-receiving surface 11 can be collected by the photodiodes 4 formed in the active layer 3 on the first surface. Thereafter, an optical layer such as an antireflection film or a color filter layer (not illustrated in the drawings) and microlenses 12 are formed, and the semiconductor device 1 illustrated in FIG. 1 is obtained.

As described above, according to the manufacturing method of the semiconductor device of the present embodiment, when the semiconductor substrate 2 is thinned, the thickness of the residual film 32 is secured so as not to make scratches on the active layer 3 over the residual film 32 by fragments peeled from the outer circumferential portions when the thinning is performed, and then a portion including the outermost circumferential portion of the semiconductor substrate 2 after the fifth process is completed and portions from which the surfaces of the bonding layer 6 and the support substrate 7 are finally peeled is removed. Therefore, when the residual film 32 in the seventh process is further thinned, it is possible to prevent the residual film 32 and the active layer 3 from being scratched, and the chip yield ratio can be improved. By preventing the outer circumferential portions from being peeled off when the residual film 32 in the seventh process is thinned, there is an effect that metal material and the like included in the peeled fragments are prevented from attaching to the surface of the thinned residual film 32, diffusing in the residual film 32, and polluting the active layer 3. Therefore, it is possible to prevent the chip yield ratio from being degraded by the metal pollution.

Fourth Embodiment

FIGS. 5A to 5I are diagrams illustrating an example of a manufacturing method of a semiconductor device according to a fourth embodiment. The configuration of the semiconductor device of the present embodiment is the same as the configuration of the semiconductor device of the first embodiment. The same portions as those of the first embodiment or portions corresponding to those of the first embodiment are given the same reference numerals as those in the first embodiment, and redundant descriptions will be omitted.

Figure 5A:
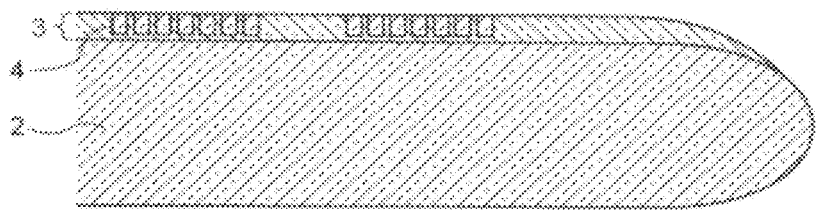
FIGS. 5A to 5J are diagrams illustrating an example of a manufacturing method of a semiconductor device according to a fourth embodiment.
Figure 5B:
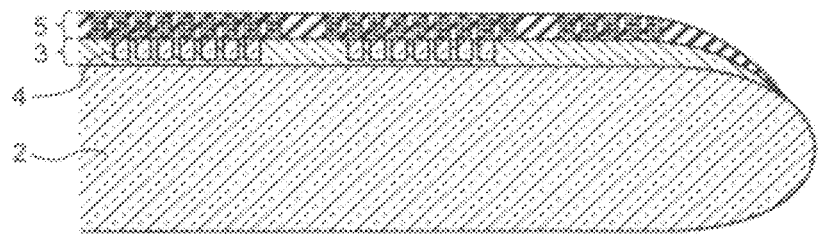
Figure 5C:
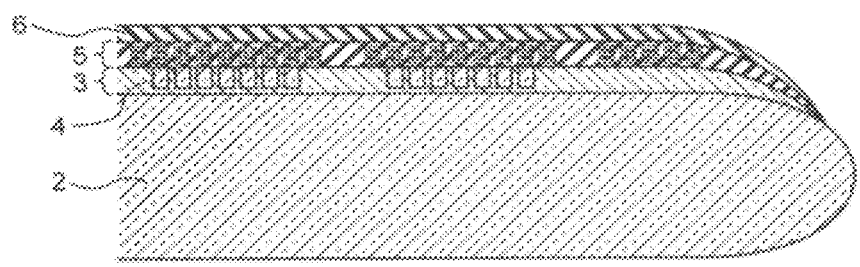
Figure 5D:
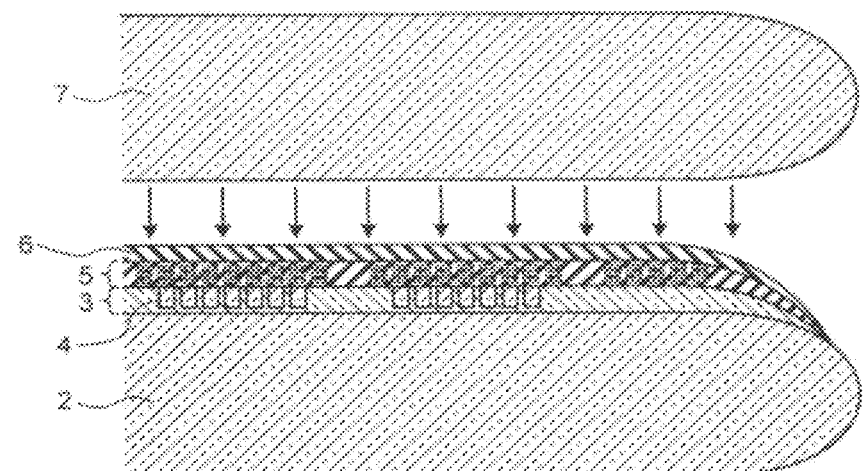
Figure 5E:
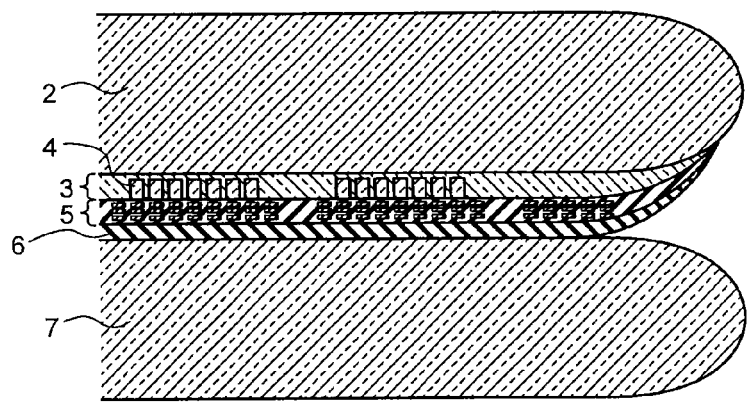

The first to the fourth processes illustrated in FIGS. 5A to 5D are the same as the first to the fourth processes of the first embodiment. FIG. 5E illustrates a state in which the support substrate 7 and the bonding layer 6 are bonded together in the fourth process and then they are placed upside down.

Figure 5F:
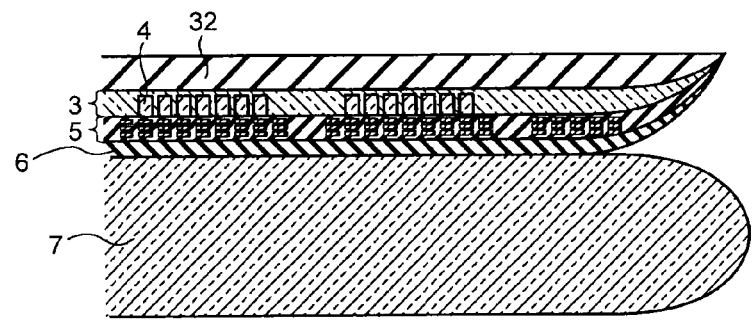

In the present embodiment, in the fifth process illustrated in FIG. 5F, the semiconductor substrate 2 is thinned from the second surface by mechanical grinding and/or chemical mechanical polishing, and the residual film 32 is formed. At this time, in the present embodiment, the thickness of the residual film 32 is formed to be thicker than the thickness of the residual film 8 of the first embodiment. For example, the thickness is desired to be about 50 µm to 150 µm so that the wiring layer 5 is not exposed on the outer circumference.

Figure 5G:
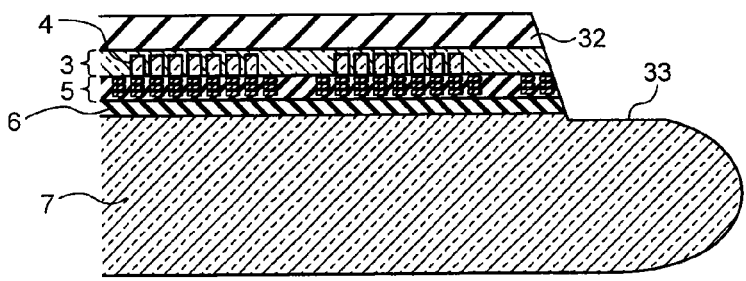

In the sixth process illustrated in FIG. 5G, the L-shaped side wall 33 is formed by removing the outer circumferential portions of the residual film 32, the active layer 3, the wiring layer 5, and the bonding layer 6 and a predetermined depth of the outer circumferential portion of the support substrate 7. The side wall 33 is formed by, for example, mechanical polishing (grinding) using an abrasive cloth, a grindstone, or a blade. The outer circumferential portions of the residual film 32, the active layer 3, the wiring layer 5, and the bonding layer 6 are desired to be formed into a taper shape. The portion to be removed only has to include the outermost circumferential portion of the semiconductor substrate 2 after the fifth process is completed and portions from which the surfaces of the bonding layer 6 and the support substrate 7 are finally peeled, and for example, a ring-shaped portion in a plan view may be removed in a state in which a bevel-shaped portion of the outer circumference of the support substrate remains.

Figure 5H:
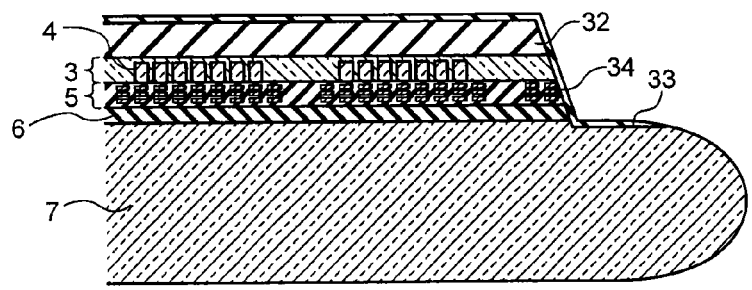

In the seventh process illustrated in FIG. 5H, a protective film 34 made of an inorganic material is formed by a CVD method so that the protective film 34 covers the surface (entire surface) of the residual film 32 and the side wall 33 formed on the active layer 3, the wiring layer 5, the bonding layer 6, and the support substrate 7. The protective film 34 is formed in a state in which a single layer or multiple layers of a silicon nitride film and/or a silicon oxynitride film are stacked. The protective film 34 may be a Low-k film made of any combination of silicon, carbon, hydrogen, oxygen, nitrogen, and fluorine as long as the wet etching selectivity with respect to the residual film 8 is ensured.

Figure 5I:
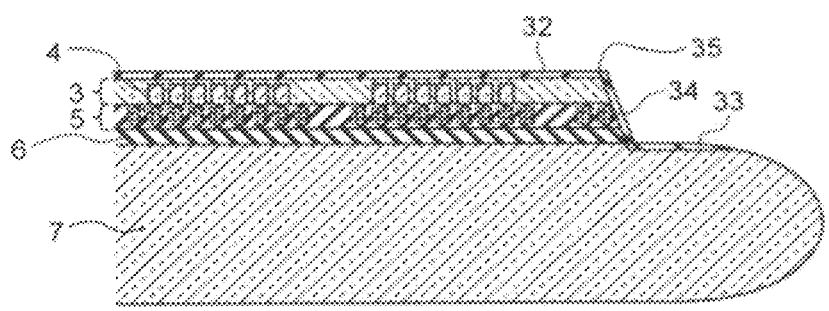

In the eighth process illustrated in FIG. 5I, the semiconductor substrate 2 is thinned from the second surface by mechanical grinding and/or chemical mechanical polishing, the protective film formed on the surface of the residual film 32 is removed, and the residual film 32 is further thinned to a predetermined thickness. In this way, the outer circumferential portion of the residual film 32 is removed, and the residual film 32 is exposed inside the opening 35 of the protective film 34. When the semiconductor substrate 2 is a silicon substrate, the residual film 32 is desired to remain at a thickness of about several µm to 50 µm, although it depends on process uniformity of the mechanical grinding and/or the chemical mechanical polishing. When the semiconductor substrate 2 is SOI, the residual film 32 may be a buried oxide film layer (thickness is tens nm to hundreds nm) or may be a silicon layer (about several µm to 50 µm). The protective film 34 may be an organic film if it can be removed by mechanical grinding. For example, the protective film 34 may be formed of a resist material, a polyimide film, a BCB film, an epoxy resin film, or the like.

Figure 5J:
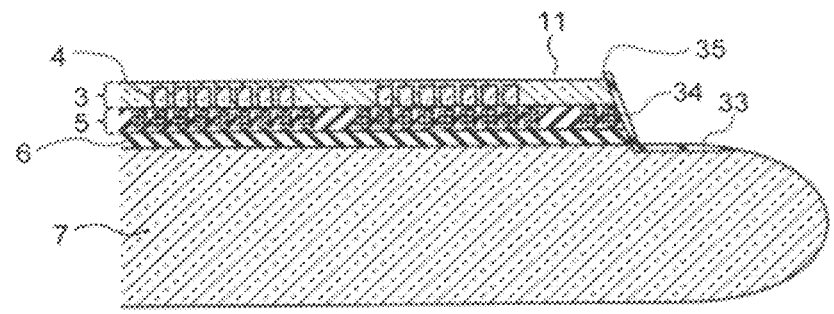

In the ninth process illustrated in FIG. 5J, at least the residual film 32 inside the opening 35 of the protective film 34 is removed by a wet etching method and the light-receiving surface 11 is formed.

In this way, the semiconductor device 1 is thinned to a thickness in which energy rays such as light and electrons emitted to the light-receiving surface 11 can be collected by the photodiodes 4 formed in the active layer 3 on the first surface. Thereafter, an optical layer such as an antireflection film or a color filter layer (not illustrated in the drawings) and microlenses 12 are formed, and the semiconductor device 1 illustrated in FIG. 1 is obtained.

By the process described above, the semiconductor substrate 2 is thinned to a thickness in which energy rays such as light and electrons emitted to the light-receiving surface 11 can be collected by the photodiodes 4 formed in the active layer 3 on the first surface. Thereafter, an optical layer such as an antireflection film or a color filter layer (not illustrated in the drawings) and microlenses 12 are formed, and the semiconductor substrate 2 is divided into chips to obtain the semiconductor device 1 illustrated in FIG. 1.

As described above, according to the manufacturing method of the semiconductor device of the present embodiment, when the semiconductor substrate 2 is thinned, the protective film 34 is formed on the outer circumferential portion with the residual film remained at a thickness larger than that of the first embodiment, and then the semiconductor substrate 2 is thinned again from the second surface side to remove the protective film 34 except for the outer circumferential portion including the side wall 33. Therefore, the same effect as that in the first embodiment can be obtained, and the wiring layer 5 is not exposed when the semiconductor substrate 2 is thinned before the protective film 34 is formed, so the risk of metal pollution can be reduced more than that in the first embodiment. No exposure process is used when the protective film 34 is formed, so the manufacturing cost can be lower than that of the first embodiment. The pollution is prevented more effectively than in the third embodiment because the protective film 34 is formed.

Fifth Embodiment

Figure 6:
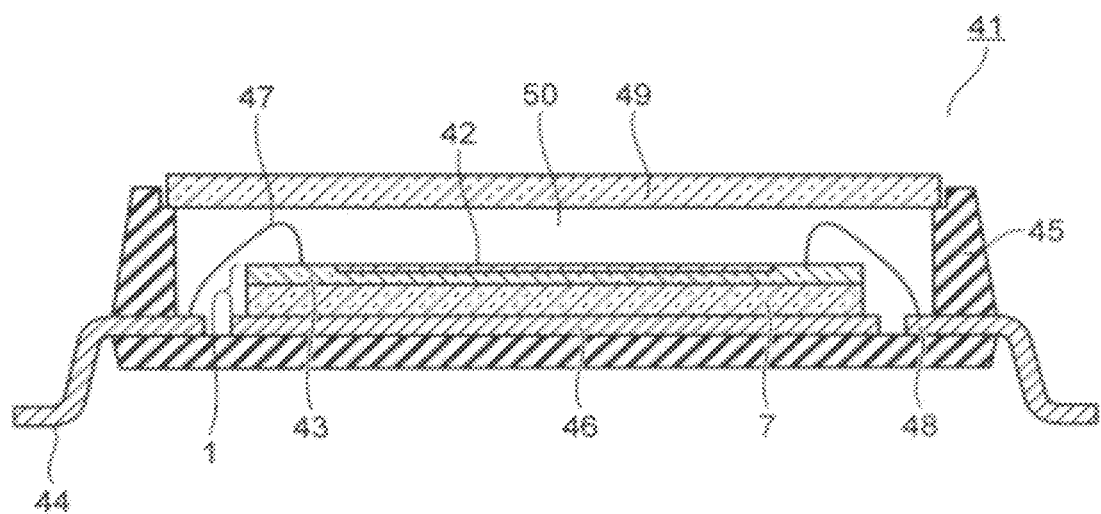
FIG. 6 is a diagram illustrating a configuration example of a camera module according to a fifth embodiment.

FIG. 6 is a diagram illustrating a configuration example of a camera module according to a fifth embodiment. FIG. 6 is a schematic view illustrating an overview of a cross-section of a camera module including the semiconductor device 1 manufactured by one of the manufacturing methods of the first to the fourth embodiments.

A camera module 41 of the present embodiment has a QFP (Quad Flat Package) type package and includes the semiconductor device 1 as its main component. The semiconductor device 1 includes light receiving elements such as photodiodes (for example, a CCD (Charge Coupled Device) type image pick-up device or a CMOS (Complementary Metal Oxide Semiconductor) type image pick-up device), a color filter, a light-receiving unit 42 (corresponding to the active layer 3 and the microlenses 12 in FIG. 1) including microlenses (not illustrated in FIG. 6), a device layer 43 (corresponding to the wiring layer 5 and the bonding layer 6 in FIG. 1) including a peripheral circuit (not illustrated in FIG. 6) and a wiring layer (not illustrated in FIG. 6), and the support substrate 7.

The semiconductor device 1 is bonded to the island portion 46 of a ceramic package 45 having rectangular and circular external terminal pins 44. Metal wires 47 electrically connect electrode portions (not illustrated in FIG. 6) of the semiconductor device 1 with wiring 48 formed on the ceramic package 45. A light-transmissive protective member 49 for protecting the light-receiving unit 42 from scratches and dusts is disposed on the semiconductor device 1. The light-transmissive protective member 49 is bonded to the surface of the ceramic package 45 via an adhesive (not illustrated in FIG. 6). A cavity 50 is provided between the light-transmissive protective member 49 and the light-receiving unit 42 so that the light collection effect of the microlenses on the light-receiving unit 42 is not impaired.

For example, the camera module 41 is set in a socket (not illustrated in FIG. 6) disposed on a substrate (not illustrated in FIG. 6) of an image pick-up device, and the semiconductor device 1 is electrically connected to the substrate (not illustrated in FIG. 6) via the metal wires 47, the wiring 48, and the external terminal pins 44.

In such a camera module 41, light coming from an object to be imaged is collected by a lens (not illustrated in FIG. 6) and the collected light is received by the light-receiving unit 42. The light received by the light-receiving unit 42 is photoelectrically converted, and the photoelectrically converted output is input as a sensor signal into a control IC (Integrated Circuit: not illustrated in FIG. 6) formed on an active area. The control IC includes a digital signal processor, processes the sensor signal by the digital signal processor to generate data of a static image or a moving image, and outputs the data to the substrate (not illustrated in FIG. 6) via the metal wires 47 and the external terminal pins 44. The substrate is connected to a storage device and a display device not illustrated in FIG. 6, and the data of the static image or the moving image is stored in the storage device or displayed on the display device.

When the semiconductor device 1 in the camera module 41 of the present embodiment is manufactured, metal pollution is prevented as described in the first to the fourth embodiments. Therefore, the camera module 41 whose imaging characteristics are improved can be stably supplied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device, the method comprising:
    forming an active layer on a first surface of a semiconductor substrate;
    forming a wiring layer on the active layer;
    forming an insulating layer so that the insulating layer covers the wiring layer;
    bonding the first surface of the semiconductor substrate and a support substrate together via the insulating layer;
    thinning the semiconductor substrate bonded to the support substrate, leaving the semiconductor substrate having a predetermined thickness which covers the active layer from a second surface;
    removing at least a part of area of the semiconductor substrate to expose the active layer;
    forming a protective layer on an outer circumferential portion of the second surface of the thinned semiconductor substrate and on the side surface of the thinned semiconductor substrate; and
    removing an area where the protective layer is not formed in the removing of the semiconductor substrate.

2. The manufacturing method of a semiconductor device according to claim 1, further comprising:
    forming a side wall continuously covering the side surface of the semiconductor substrate and an outer circumferential portion of the support substrate by removing the side surface of the thinned semiconductor substrate and a part of the outer circumferential portion of the support substrate facing the semiconductor substrate; and
    forming the protective layer so that the protective layer covers the outer circumferential portion of the second surface and the side surface of the semiconductor substrate on which the side wall has been formed, and at least a part of the outer circumferential portion of the support substrate which is removed and exposed.

3. The manufacturing method of a semiconductor device according to claim 1, further comprising:
    forming a side wall continuously covering the side surface of the semiconductor substrate and an outer circumferential portion of the support substrate by removing the side surface of the thinned semiconductor substrate and a part of the outer circumferential portion of the support substrate facing the semiconductor substrate;
    thinning the semiconductor substrate on which the side wall has been formed from the second surface side; and
    removing entire area of the semiconductor substrate to expose the active layer.

4. The manufacturing method of a semiconductor device according to claim 3, further comprising:
    forming the protective layer covering the second surface and the side wall of the semiconductor substrate on which the side wall has been formed;
    removing the protective layer except for the side surface of the semiconductor substrate in the thinning of the semiconductor substrate, and
    removing an area where the protective layer is not formed in the removing of the semiconductor substrate.

5. The manufacturing method of a semiconductor device according to claim 1, wherein
    the protective layer is formed of at least one of a silicon nitride film, a silicon oxynitride film, a Low-k film, and an organic material.

6. The manufacturing method of a semiconductor device according to claim 4, wherein
    the protective layer is formed of at least one of a silicon nitride film, a silicon oxynitride film, a Low-k film, and an organic material.

7. The manufacturing method of a semiconductor device according to claim 1, wherein
    the diameter of the semiconductor substrate which has been thinned is smaller than the diameter of the support substrate.

\* \* \* \* \*